(12) United States Patent  
Hoffman (10) Patent No.: US 6,630,661 B1
(45) Date of Patent: Oct. 7, 2003

(54) SENSOR MODULE WITH INTEGRATED DISCRETE COMPONENTS MOUNTED ON A WINDOW

(75) Inventor: Paul Robert Hoffman, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 84 days.

(21) Appl. No.: 10/012,378

(22) Filed: Dec. 12, 2001

(51) Int. Cl.[7] ................................................ H01J 40/14
(52) U.S. Cl. ...................... 250/239; 250/216; 438/116
(58) Field of Search ............................. 250/208.1, 216, 250/239; 348/373; 438/66, 116, 118; 257/433, 434, 432, 680, 629

(56) References Cited

U.S. PATENT DOCUMENTS

| | | | |
|---|---|---|---|
| 4,326,214 A | * | 4/1982 | Trueblood ................ 257/681 |
| 4,636,647 A | * | 1/1987 | Nishizawa ................ 250/551 |
| 4,894,707 A | * | 1/1990 | Yamawaki et al. ........ 257/680 |
| 5,210,400 A | * | 5/1993 | Usami ..................... 250/208.1 |
| 5,786,589 A | | 7/1998 | Segawa et al. .......... 250/208.1 |
| 5,821,532 A | | 10/1998 | Beaman et al. ............ 250/239 |
| 5,867,368 A | * | 2/1999 | Glenn ....................... 361/783 |
| 5,950,074 A | * | 9/1999 | Glenn et al. ............... 438/121 |
| 6,046,070 A | | 4/2000 | Shoji et al. .................. 438/66 |
| 6,117,705 A | * | 9/2000 | Glenn et al. ............... 438/106 |
| 6,130,448 A | | 10/2000 | Bauer et al. ................ 257/222 |
| 6,342,670 B1 | * | 1/2002 | Lin et al. .................... 136/251 |

* cited by examiner

Primary Examiner—Stephone Allen
Assistant Examiner—Eric Spears
(74) Attorney, Agent, or Firm—Gunnison, McKay & Hodgson, L.L.P.; Serge J. Hodgson (57) ABSTRACT

An optical module includes a window having an interior, e.g., first, surface. The interior surface includes a central region and a peripheral region. A first electronic component is coupled to the peripheral region. The optical module further includes a substrate and an image sensor coupled to the substrate. The window is coupled to the substrate such that the image sensor is aligned with the central region of the window.

20 Claims, 5 Drawing Sheets

SENSOR MODULE WITH INTEGRATED DISCRETE COMPONENTS MOUNTED ON A WINDOW

BACKGROUND OF THE INVENTION

1. Field of the Invention

The present invention relates generally to the packaging of electronic components. More particularly, the present invention relates to an electronic component package and method of fabricating the same.

2. Description of the Related Art

Image sensors are well known to those of skill in the art. An image sensor included an active area, which was responsive to electromagnetic radiation. The image sensor was incorporated into an image sensor package, which protected the image sensor from dust and moisture.

To allow the image sensor to operate, other electronic components associated with the image sensor were often used. For example, an ASIC controller chip was often used to control the operation of the image sensor. As a further example, passive elements were combined to filter input signals to the image sensor.

The other associated electronic components were mounted to the printed circuit mother board separate from the image sensor package. However, this required area on the printed circuit mother board to be allocated for the other associated electronic components. Further, mounting the other associated electronic components at the printed circuit mother board level of fabrication was relatively labor-intensive, complex, and thus expensive.

As the art moved to smaller, lighter weight, and less expensive devices, the other associated electronic components were packaged along with the image sensor in an optical module, sometimes also called an image sensor package. The optical module was then mounted to the printed circuit mother board.

To form the optical module, the image sensor, along with the other associated electronic components, were mounted to a common substrate. Thus, although the optical module required less area to be allocated on the printed circuit mother board than mounting the other associated electronic components separately to the printed circuit mother board, area on the common substrate of the optical module was nevertheless allocated for the other associated electronic components. This, in turn, prevented miniaturization of the optical module.

SUMMARY OF THE INVENTION

Ad In accordance with one embodiment of the present invention, an optical module includes a window having an interior, e.g., first, surface. The interior surface includes a central region and a peripheral region. A first electronic component is coupled to the peripheral region. The optical module further includes a substrate and an image sensor coupled to the substrate. The window is coupled to the substrate such that the image sensor is aligned with the central region of the window.

In one embodiment, the peripheral region of the window is used to support the electronic component, which is associated with the image sensor. Since electromagnetic radiation passing through the peripheral region of the window is not used by the image sensor, the peripheral region can be obstructed by the electronic component without causing any detrimental performance of the image sensor.

Further, by using the peripheral region of the window to support the electronic component, the requirement to allocate area on the substrate for the electronic component is eliminated. Accordingly, the optical module can be formed to have a minimum size and is well suited for use with smaller, lighter weight, and less expensive devices, e.g., cameras and cellular telephones.

The present invention is best understood by reference to the following detailed description when read in conjunction with the accompanying drawings.

BRIEF DESCRIPTION OF THE DRAWINGS

Common reference numerals are used throughout the drawings and detailed description to indicate like elements.

DETAILED DESCRIPTION

In accordance with one embodiment of the present invention, a peripheral region PR of a window 130 (FIG. 1) of an optical module 100 is used to support electronic components 132, 154 associated with an image sensor 108. Since electromagnetic radiation passing through peripheral region PR of window 130 is not used by image sensor 108, peripheral region PR can be obstructed by electronic components 132, 154 without causing any detrimental performance of image sensor 108.

Figure 1:
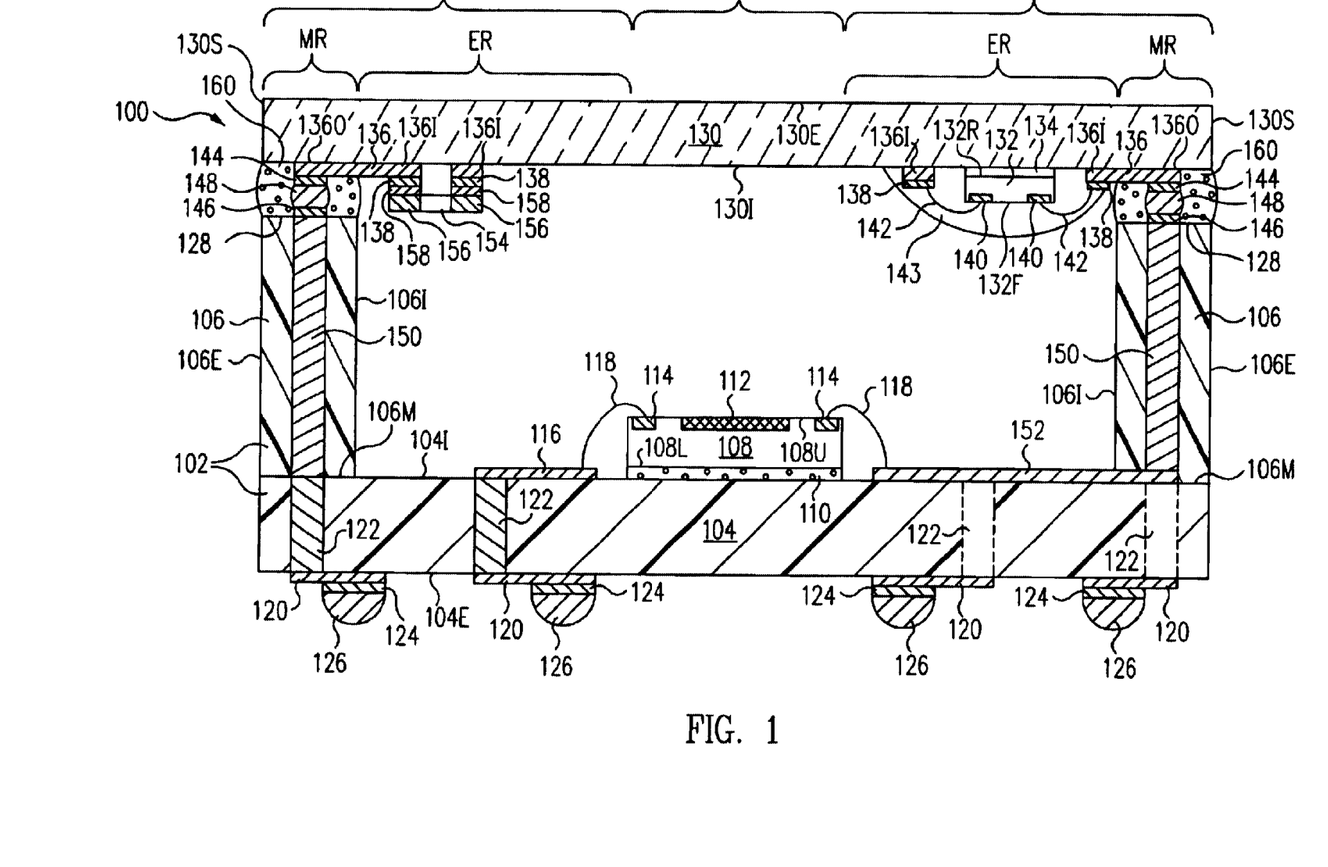
FIG. 1 is a cross-sectional view of an optical module in accordance with one embodiment of the present invention.

By using peripheral region PR of window 130 to support electronic components 132, 15,4, the requirement to allocate area on a substrate 102 for electronic components 132, 154 is eliminated. Accordingly, optical module 100 can be formed to have a minimum size and is well suited for use with smaller, lighter weight, and less expensive devices, e.g., cameras and cellular telephones.

More particularly, FIG. 1 is a cross-sectional view of an optical module 100 in accordance with one embodiment of the present invention. Optical module 100 is used in a wide variety of applications, e.g., cameras and cellular telephones.

Optical module 100 includes a substrate 102, e.g., formed of ceramic or laminate, although other substrate materials are used in other embodiments. Substrate 102 is a rectangular cup shape enclosure and includes a base 104 and a sidewall 106. Sidewall 106 is formed around a periphery of base 104 and extended upwards, e.g., in a first direction, from base 104. In this embodiment, base 104 and sidewall 106 are separate pieces connected together, e.g., with adhesive (not shown).

Base 104 includes an interior, e.g., first, surface 104I and an exterior, e.g., second, surface 104E. Mounted, sometimes called die attached, to interior surface 104I is an image sensor 108, sometimes called an electronic component. More particularly, a lower, e.g., first, surface 108L of image sensor 108 is mounted to interior surface 104I with an adhesive 110, sometimes called a die attach adhesive.

Image sensor 108 further includes an upper, e.g., second, surface 108U. An active area 112 and bond pads 114 of image sensor 108 are on upper surface 108U. Although bond pads 114 are illustrated as being on both sides of image sensor 108, in alternative embodiments, bond pads 114 are formed only along a single side of image sensor 108. In this embodiment, interior surface 104I, lower surface 108L, and upper surface 108U are parallel to one another.

Generally, active area 112 of image sensor 108 is responsive to electromagnetic radiation, as is well known to those of skill in the art. For example, active area 112 is responsive to infrared radiation, ultraviolet radiation, and/or visible light. Illustratively, image sensor 108 is a CMOS image sensor device, a charge coupled device (CCD), a pyroelectric device, or an erasable programmable read-only memory device (EPROM) although other image sensors are used in other embodiments.

A Formed on interior surface 104I of substrate 102 are a plurality of electrically conductive interior traces 116. Interior traces 116 are electrically connected to bond pads 114 by bond wires 118. In one embodiment, bond wires 118 are enclosed within an encapsulant (not shown), which does not cover and leaves exposed active area 112.

Formed on exterior surface 104E of substrate 102 are a plurality of electrically conductive exterior traces 120. Extending through base 104 from exterior surface 104E to interior surface 104I are a plurality of electrically conductive base vias 122. Exterior traces 120 are electrically connected to interior traces 116 by base vias 122. Base vias 122 which otherwise would not be visible in the view of FIG. 1 are indicated in dashed lines for purposes of illustration.

Formed on exterior traces 120 are electrically conductive pads 124. Formed on pads 124 are electrically conductive interconnection balls 126, e.g., solder. Interconnection balls 126 are used to connect optical module 100 to a larger substrate such as a printed circuit mother board.

In one embodiment, interior traces 116 and/or exterior traces 120 are covered with a dielectric protective layer, e.g., solder mask, as those of skill in the art will understand.

As set forth above, electrically conductive pathways between bond pads 114 and interconnection balls 126 are formed by bond wires 118, interior traces 116, base vias 122, exterior traces 120, and pads 124.

Although a particular electrically conductive pathway between bond pads 114 and interconnection balls 126 is described above, other electrically conductive pathways can be formed. For example, contact metallizations can be formed between the various electrical conductors, e.g., between bond pads 114 and bond wires 118, between bond wires 118 and interior traces 116, between exterior traces 120 and pads 124, and/or between pads 124 and interconnection balls 126. Alternatively, pads 124 are not formed and interconnection balls 126 are formed directly on exterior traces 120.

As yet another alternative, interconnection balls 126 are distributed in an array format to form a ball grid array (BGA) type package. Alternatively, interconnection balls 126 (or interconnection balls 126 and pads 124) are not formed, e.g., to form a metal land grid array (LGA) type package. In yet another alternative, a leadless chip carrier (LCC) type package is formed. BGA, LGA and LCC type packages are well known to those of skill in the art. Other electrically conductive pathway modifications will be obvious to those of skill in the art.

Sidewall 106 of substrate 102 includes an interior surface 106I and an exterior surface 106E. In this embodiment, interior surface 106I is parallel to exterior surface 106E. Further, interior surface 106I and exterior surface 106E are perpendicular to interior surface 104I and exterior surface 104E, which are parallel to one another. Although various structures may be described as being parallel or perpendicular, it is understood that the structures may not be exactly parallel or perpendicular but only substantially parallel or perpendicular to within accepted manufacturing tolerances.

Extending between exterior surface 106E and interior surface 106I of sidewall 106 is a base mounting surface 106M of sidewall 106 of substrate 102. Base mounting surface 106M of sidewall 106 is mounted to the periphery of interior surface 104I of base 104, e.g., with adhesive (not shown).

Opposite of base mounting surface 106M and also extending between exterior surface 106E and interior surface 106I of sidewall 106 is a window mounting and connection surface 128 of sidewall 106 of substrate 102. Window mounting and connection surface 128 is parallel to base mounting surface 106M, interior surface 104I and exterior surface 104E of base 104 of substrate 102. Window mounting and connection surface 128 is annular when viewed from above, e.g., is a rectangular annulus.

Mounted to substrate 102 is a window 130. In this embodiment, window 130 is planar, i.e., is a flat piece. Window 130 includes an interior, e.g., first, surface 130I and an exterior, e.g., second, surface 130E. A side 130S of window 130 extends between interior surface 130I and exterior surface 130E.

Exterior surface 130E is exposed to the ambient environment. Although window 130 as a flat piece is set forth above and illustrated in FIG. 1, in an alternative embodiment, window 130 has a different shape, e.g., is curved, cap shaped or otherwise has a non-planar shape.

Window 130 includes a peripheral region PR and a central region CR. Peripheral region PR is adjacent side 130S of window 130 and extends around central region CR. Central region CR is aligned with and directly above active area 112 of image sensor 108.

Window 130 is transparent to the electromagnetic radiation to which active area 112 of image sensor 108 is responsive. For example, window 130 is a glass window such as a borosilicate glass window although window 130 is formed of other materials such as plastic in other embodiments.

During use, electromagnetic radiation is directed at optical module 100 including image sensor 108. This electromagnetic radiation passes through central region CR of window 130. Central region CR of window 130 is unobstructed thus preventing distortion of the electromagnetic radiation passing through central region CR. After passing through central region CR of window 130, the electromagnetic radiation strikes active area 112, which responds to the electromagnetic radiation as is well known to those of skill in the art.

However, in an alternative embodiment, active area 112 of image sensor 108 transmits electromagnetic radiation. For example, image sensor 108 is a light emitting diode (LED) micro-display. In accordance with this embodiment, electromagnetic radiation transmitted by active area 112 passes through central region CR of window 130 and emanates from optical module 100.

For simplicity, in the above and following discussions, active area 112 as a receiver of electromagnetic radiation is set forth. However, in light of this disclosure, those of skill in the art will recognize that generally active area 112 is a receiver of electromagnetic radiation, a transmitter of electromagnetic radiation, or a transceiver, i.e., a transmitter and a receiver, of electromagnetic radiation.

Peripheral region PR of window 130 is not aligned, sometimes called offset, from active area 112 of image sensor 108. During use, electromagnetic radiation striking active area 112 has passed only through central region CR and not through peripheral region PR of window 130. Since electromagnetic radiation passing through peripheral region PR of window 130 is not used by image sensor 108, peripheral region PR of window 130 can be obstructed without causing any detrimental performance of image sensor 108.

Peripheral region PR of window 130 is used to support electronic components associated with image sensor 108. More particularly, these electronic components are mounted to peripheral region PR of interior surface 130I of window 130. Illustratively, (1) passive components such as inductors, resistors, capacitors; (2) active discrete components such as diodes; and/or (3) active components such as integrated circuits, are mounted to peripheral region PR of interior surface 130I of window 130. These electronic components are electrically connected to bond pads 114 of image sensor 108 and/or to interconnection balls 126 as discussed further below.

By using peripheral region PR of window 130 to support electronic components associated with image sensor 108, the requirement to allocate area on substrate 102 for the electronic components is eliminated. Accordingly, optical module 100 can be formed to have a minimum size and is well suited for use with smaller, lighter weight, and less expensive devices, e.g., cameras and cellular telephones.

In accordance with this embodiment, optical module 100 includes an active component 132, e.g., an integrated circuit such as a controller chip for image sensor 108. Active component 132 is mounted to peripheral region PR of interior surface 130I of window 130 in a wirebond configuration. More particularly, a rear surface 132R of active component 132 is mounted to peripheral region PR of interior surface 130I of window 130 by an adhesive 134.

Formed on peripheral region PR of interior surface 130I of window 130 are electrically conductive component traces 136. Formed on component traces 136 are electrically conductive component pads 138, sometimes called contact metallizations. Electrically conductive bond pads 140, sometimes called terminals, on a front surface 132F of active component 132 are electrically connected to component pads 138 and thus component traces 136 by electrically conductive bond wires 142. Optionally, an encapsulant 143, sometimes called a glob top encapsulant, is formed to enclose and protect active component 132, bond wires 142, component pads 138 and inner ends 136I of component traces 136.

Also formed on component traces 136 are electrically conductive window pads 144, sometimes called contact metallizations. Illustratively, component pads 138 are formed on inner ends 136I of component traces 136 and window pads 144 are formed on outer ends 136O of component traces 136, i.e., component pads 138 and window pads 144 are formed on opposite ends of component traces 136.

Formed on window mounting and connection surface 128 are electrically conductive substrate pads 146. Substrate pads 146 are electrically connected to window pads 144 by electrically conductive bumps 148, e.g., solder, gold, or electrically conductive adhesive.

Substrate pads 146 are electrically connected to electrically conductive sidewall vias 150. Sidewall vias 150 extend through sidewall 106 from window mounting and connection surface 128 to base mounting surface 106M of sidewall 106.

Also formed on interior surface 104I of base 104 of substrate 102 are electrically conductive connector interior traces 152. Connector interior traces 152 are formed adjacent image sensor 108. Bond pads 114 of image sensor 108 are electrically connected to connector interior traces 152 by bond wires 118.

Connector interior traces 152 extend along interior surface 104I of base 104 from image sensor 108 to sidewall 106. Connector interior traces 152 further extend between base mounting surface 106M of sidewall 106 and interior surface 104I of base 104 and to sidewall vias 150. Connector interior traces 152 are electrically connected to sidewall vias 150, e.g., by electrically conductive adhesive, solder, direct contact and/or other electrically conductive structures. In one embodiment, connector interior traces 152 and the corresponding sidewall vias 150 are integral, i.e., are parts of a single electrical conductor and are not separated electrical conductors connected together.

As set forth above, electrically conductive pathways between bond pads 114 of image sensor 108 and bond pads 140 of active component 132 are formed by bond wires 118, connector interior traces 152, sidewall vias 150, substrate pads 146, bumps 148, window pads 144, component traces 136, component pads 138 and bond wires 142.

Although a particular electrically conductive pathway between bond pads 114 of image sensor 108 and bond pads 140 of active component 132 is described above, other electrically conductive pathways can be formed. For example, contact metallizations can be formed between the various electrical conductors.

Alternatively, component pads 138 are not formed and bond wires 142 are directly connected to component traces 136. As another alternative, window pads 144 and/or substrate pads 146 are not formed and component traces 136 are directly connected to sidewall vias 150 by bumps 148.

Optical module 100 further includes a passive component 154 such as an inductor, a resistor, or a capacitor. Passive component 154 is a discrete surface mounted passive electronic component.

More particularly, passive component 154 includes terminals 156. Terminals 156 are mounted to component pads 138 and thus component traces 136 by joints 158, e.g., solder joints. Component traces 136 are electrically connected to sidewall vias 150 as described above.

In accordance with this embodiment, sidewall vias 150 are electrically connected to base vias 122, e.g., by electrically conductive adhesive, solder, direct contact and/or other electrically conductive structures. As set forth above, base vias 122 extend through base 104 from interior surface 104I to exterior surface 104E. Base vias 122 are electrically connected to interconnection balls 126 as discussed above.

Thus, electrically conductive pathways between terminals 156 and interconnection balls 126 are formed by joints 158, component pads 138, component traces 136, window pads 144, bumps 148, substrate pads 146, sidewall vias 150, base vias 122, exterior traces 120, and pads 124.

Although a particular electrically conductive pathway between terminals 156 and interconnection balls 126 is described above, other electrically conductive pathways can be formed. For example, contact metallizations can be formed between the various electrical conductors.

Alternatively, component pads 138 are not formed and joints 158 are directly connected to component traces 136. As another alternative, window pads 144 and/or substrate pads 146 are not formed and component traces 136 are directly connected to sidewall vias 150 by bumps 148.

In an alternative embodiment, substrate 102 is integral, i.e., base 104 and sidewall 106 are parts of a single piece and are not separate pieces connected together. In accordance with this embodiment, sidewall vias 150 and the corresponding base vias 122 are integral, i.e., are parts of a single via and are not separate vias connected together.

Window 130 is mounted to window mounting and connection surface 128 of substrate 102 by bumps 148 in combination with a window adhesive 160. Window adhesive 160 bonds a window mounting region MR of interior surface 130I of window 130 adjacent side 130S to window mounting and connection surface 128 of substrate 102. To the extent that window 130 has a different thermal coefficient expansion than substrate 102, window adhesive 160 minimizes failure of bumps 148 from thermal stresses between window 130 and substrate 102.

Further, window adhesive 160 forms a seal between window 130 and substrate 102, which protects image sensor 108 and the electronic components mounted to interior surface 130I of window 130, e.g., active component 132 and passive component 154, from environmental degradation, e.g., from dust and moisture.

More particularly, substrate 102, window 130 and window adhesive 160 form an enclosure around image sensor 108, active component 132 and passive component 154 and protect image sensor 108, active component 132 and passive component 154 from the ambient environment.

Figure 2:
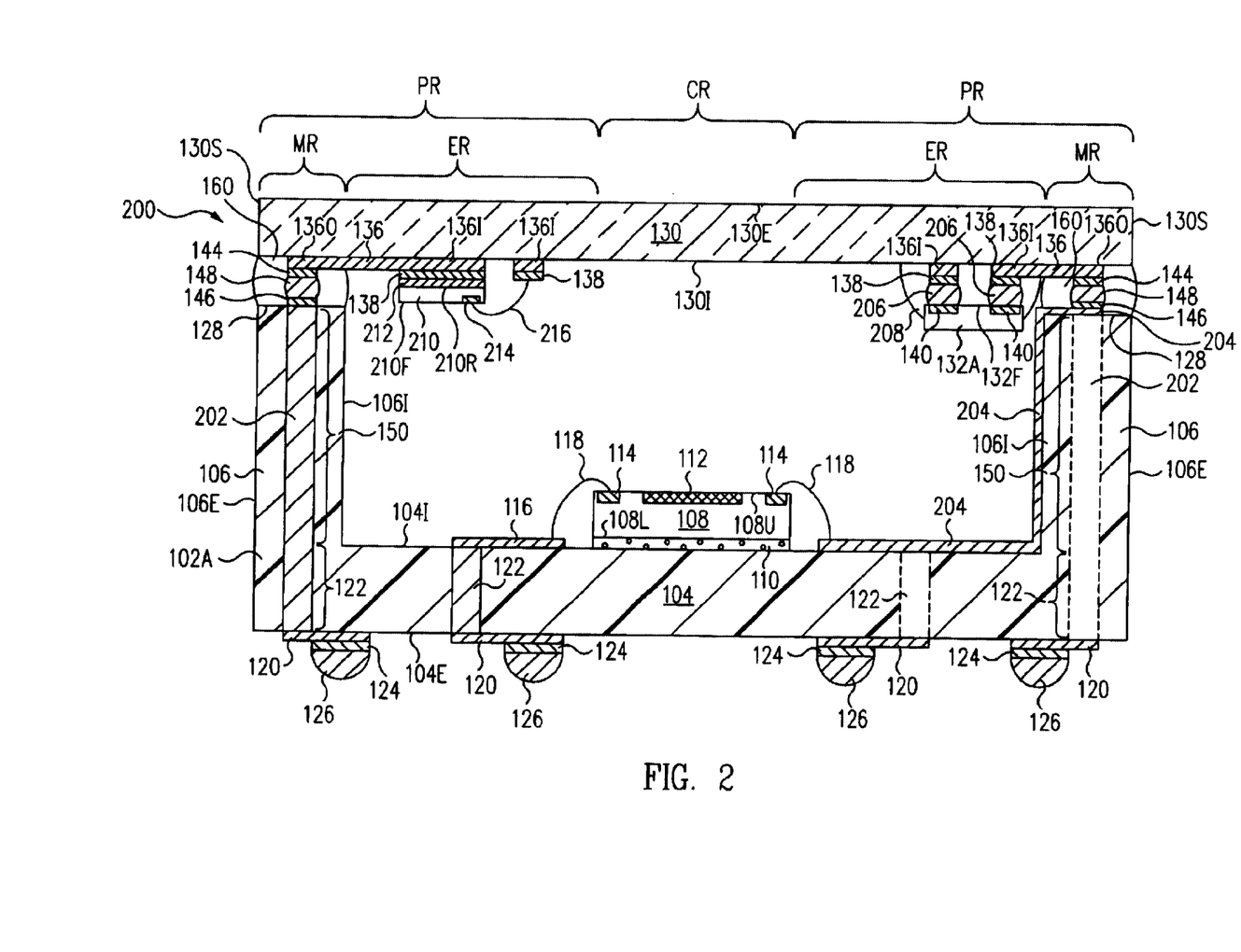
FIG. 2 is a cross-sectional view of an optical module in accordance with another embodiment of the present invention.

FIG. 2 is a cross-sectional view of an optical module 200 in accordance with another embodiment of the present invention. Optical module 200 of FIG. 2 is similar to optical module 100 of FIG. 1 and only the significant differences are discussed below.

Referring now to FIG. 2, substrate 102A is integral, i.e., base 104 and sidewall 106 are parts of a single piece and are not separate parts connected together. Further, sidewall vias 150 and the corresponding base vias 122 are integral, i.e., sidewall vias 150 and the corresponding base vias 122 are parts of single vias 202 and are not separate vias connected together.

Further, bond wires 118 electrically connect bond pads 114 of image sensor 108 to connector traces 204. Connector traces 204 extend along interior surface 104I of base 104 from image sensor 108 to sidewall 106. Connector traces 204 further extend along interior surface 106I of sidewall 106 from base 104 to window mounting and connection surface 128. Connector traces 204 further extend from interior surface 106I of sidewall 106 along window mounting and connection surface 128. Substrate pads 146 are formed on connector traces 204.

Optical module 200 further includes an active component 132A. Active component 132A is mounted to peripheral region PR of interior surface 130I of window 130 in a flip chip configuration. More particularly, bond pads 140, sometimes called terminals, on front surface 132F of active component 132A are electrically connected to component pads 138 and thus component traces 136 by electrically conductive bumps 206, sometimes called flip chip bumps.

Optionally, an underfill 208 fills the region between front surface 132F of active component 132A and interior surface 130I of window 130. Underfill 208 encloses and protects bumps 206, component pads 138 and inner ends 136I of component traces 136.

Optical module 200 further includes an active discrete component 210, e.g., a diode. Active discrete component 210 is mounted to peripheral region PR of interior surface 130I of window 130. More particularly, a rear surface 210R of active discrete component 210 is mounted to a component pad 138 and thus to a component trace 136 by an electrically conductive adhesive 212, e.g., solder or electrically conductive epoxy.

An electrically conductive bond pad 214, sometimes called a terminal, on a front surface 210F of active discrete component 210 is electrically connected to a component pad 138 and thus to a component trace 136 by an electrically conductive bond wire 216.

Figure 3:
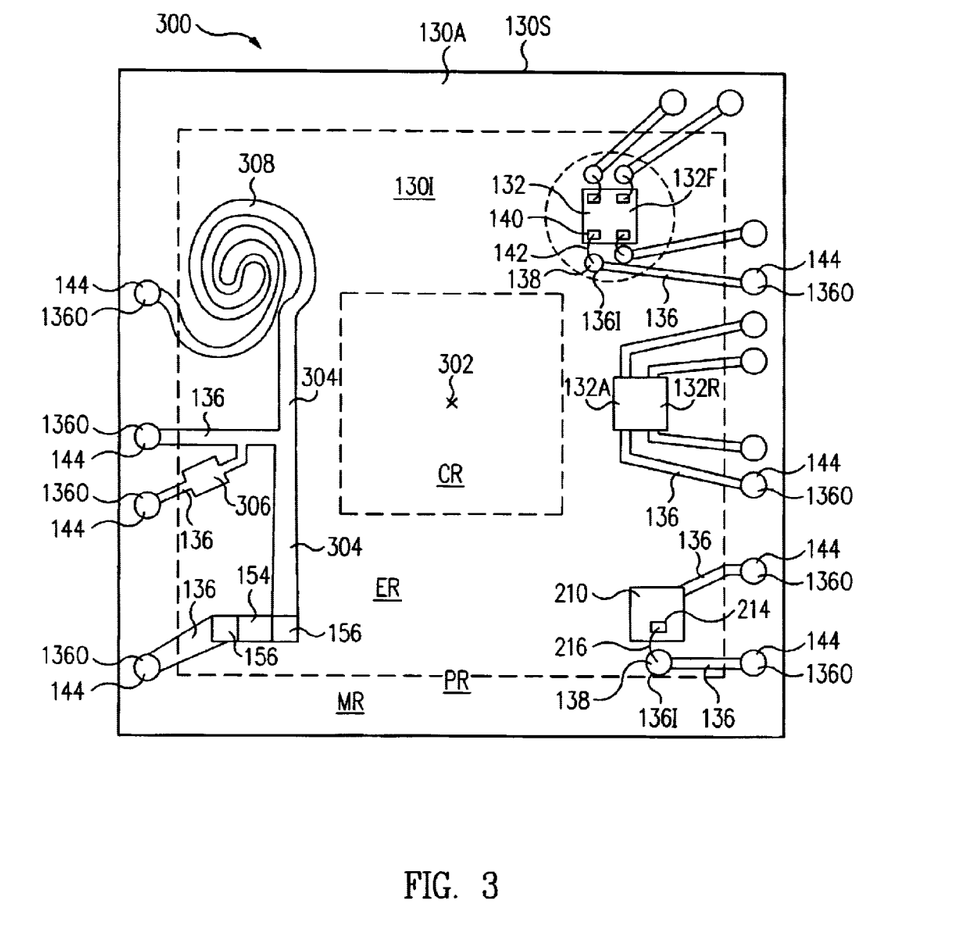
FIG. 3 is a bottom plan view of a window assembly in accordance with one embodiment of the present invention.

FIG. 3 is a bottom plan view of a window assembly 300 in accordance with one embodiment of the present invention. As shown in FIG. 3, window assembly 300 includes a window 130A having an interior surface 130I. Interior surface 130I includes central region CR and peripheral region PR. In this embodiment, central region CR is located at or near a center 302 of interior surface 130I of window 130. However, as described above, central region CR is aligned with active area 112 of image sensor 108 (FIG. 1). Accordingly, in other embodiments, central region CR is offset from center 302 depending upon the particular location of image sensor 108.

The portion of interior surface 130I of window 130 other than central region CR forms peripheral region PR. In this embodiment, peripheral region PR surround central region CR and extends between side 130S of window 130A and central region CR.

Peripheral region PR includes an electronic component mounting region ER and a window mounting region MR. As shown in FIG. 3, window mounting region MR is a rectangular annulus formed directly adjacent side 130S around the entire periphery of interior surface 130I of window 130A. As discussed above, window mounting region MR is bonded to window mounting and connection surface 128 of substrate 102 (FIG. 1).

The portion of interior surface 130I of window 130A other than central region CR and window mounting region MR is electronic component mounting region ER. Generally, electronic components are mounted to electronic component mounting region ER.

In this embodiment, active component 132, active component 132A, active discrete component 210, and passive component 154 are mounted generally to interior surface 130I, and, more particularly, to peripheral region PR of interior surface 130I, and, specifically, to electronic component mounting region ER of peripheral region PR of interior surface 130I of window 130A. Active component 132, active component 132A, active discrete component 210, and passive component 154 are mounted as discussed above in reference to FIGS. 1 and 2.

As shown in FIG. 3, component traces 136 extend from electronic component mounting region ER to window mounting region MR. More particularly, inner ends 136I of component traces 136 and, if formed, component pads 138 are formed within and are on electronic component mounting region ER. Outer ends 136O of component traces 136 and, if formed, window pads 144 are formed within and are on window mounting region MR of interior surface 130I of window 130A. Outer ends 136O of component traces 136 and, if formed, window pads 144 are sometimes called input/output (I/O) pads.

In one embodiment, electronic components mounted to electronic component mounting region ER are electrically connected to one another by electrically conductive component interconnection traces 304 formed on interior surface 130I of window 130A. For example, electronic components mounted to electronic component mounting region ER are electrically connected to one another to form circuit elements such as filters.

To illustrate, referring still to FIG. 3, a resistor 306 and an inductor 308 are formed on and/or mounted to interior surface 130I of window 130. Inductor 308, resistor 306, and passive component 154, e.g., an inductor, resistor, or capacitor, are electrically connected to one another by component interconnection traces 304 to form a circuit element such as a filter.

Figure 4:
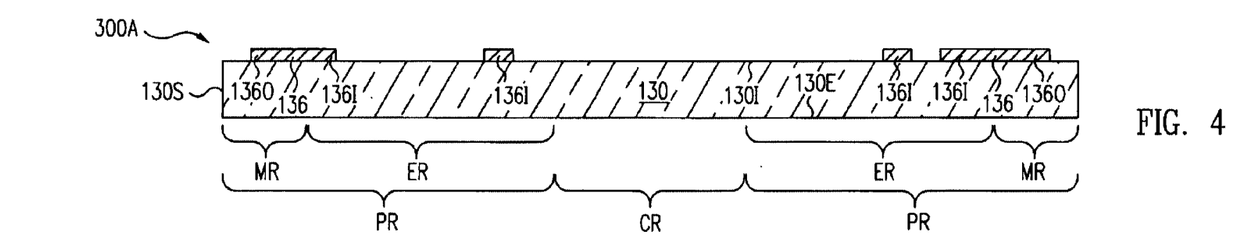
FIG. 4 is a cross-sectional view of a window assembly during fabrication in accordance with one embodiment of the present invention.

FIG. 4 is a cross-sectional view of a window assembly 300A during fabrication in accordance with one embodiment of the present invention. As shown in FIG. 4, component traces 136 are formed on interior surface 130I of window 130.

In one embodiment, component traces 136 are thin film metallizations, e.g., having a thickness of 10m although component traces 136 have other thicknesses in other embodiments. For example, component traces 136 are formed by sputtering or otherwise depositing an electrically conductive material such as a metal containing material. A mask, e.g., photoresist, is formed on the electrically conductive material. The electrically conductive material is etched, and the mask is removed. Generally, an electrically conductive material is formed on interior surface 130I and then selectively patterned to form component traces 136.

In another embodiment, component traces 136 are thick film metallizations. For example, component traces 136 are formed by screen printing an electrically conductive paste, and then heating the screened paste. Generally, an electrically conductive material is selectively formed to form component traces 136.

In one embodiment, referring now to FIGS. 3 and 4 together, inductor 308, resistor 306 and/or component interconnection traces 304 are formed simultaneously with component traces 136. However, in alternative embodiments, as described further below, inductor 308 and/or resistor 306 are separate electronic components, which are mounted to component traces 136.

Figure 5:
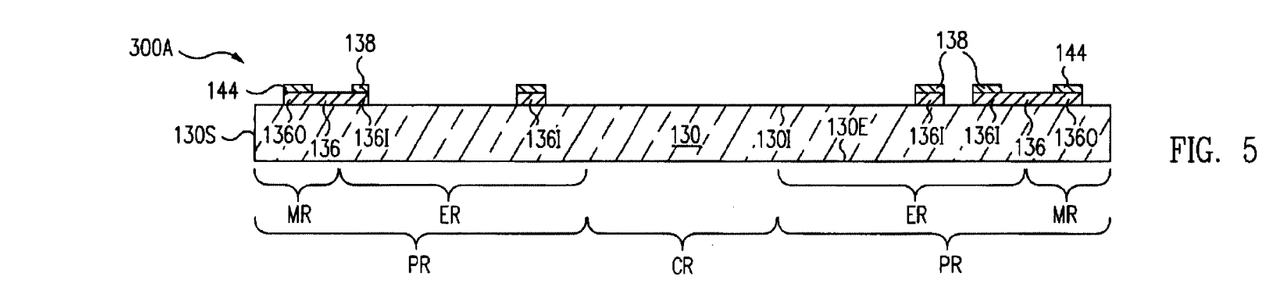
FIGS. 5 and 6 are cross-sectional views of the window assembly of FIG. 4 at further stages of fabrication in accordance with embodiments of the present invention.

FIG. 5 is a cross-sectional view of window assembly 300A of FIG. 4 at a further stage of fabrication in accordance with one embodiment of the present invention. As shown in FIG. 5, component pads 138 and window pads 144 are formed on component traces 136. More particularly, component pads 138 are formed on inner ends 136I of component traces 136. Window pads 144 are formed on outer ends 136O of component traces 136. Illustratively, component pads 138 and window pads 144 are formed by plating or otherwise selectively depositing an electrically conductive material on inner ends 136I and outer ends 136O of component traces 136, respectively. However, in alternative embodiments, component pads 138 and/or window pads 144 are not formed.

Figure 6:
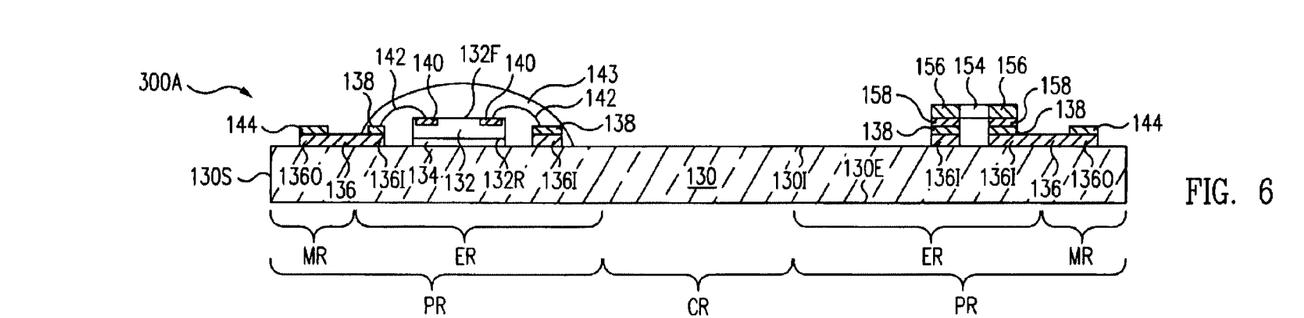

FIG. 6 is a cross-sectional view of window assembly 300A of FIG. 5 at a further stage of fabrication in accordance with one embodiment of the present invention. As shown in FIG. 6, active component 132 and passive component 154 are mounted to electronic component mounting region ER of peripheral region PR of interior surface 130I of window 130. Illustratively, joints 158, e.g., solder, are formed between terminals 156 of passive component 154 and component pads 138 to mount passive component 154.

To mount active component 132, rear surface 132R of active component 132 is attached to interior surface 130I by adhesive 134. Bond pads 140 of active component 132 are electrically connected to component pads 138/component traces 136 by bond wires 142 using a wirebonding tool. Optionally, encapsulant 143 is applied to enclose bond pads 140, bond wires 142, component pads 138, and inner ends 136I of component traces 136.

Although mounting of active component 132 and passive component 154 is illustrated in FIG. 6 and discussed above, in light of this disclosure, those of skill in the art will understand that a wide variety of electronic components can be mounted to electronic component mounting region ER of peripheral region PR of interior surface 130I of window 130 in accordance with alternative embodiments of the present invention. For example, referring to FIGS. 3 and 6 together, active component 132A, active discrete component 210, resistor 306, and/or inductor 308 are mounted to electronic component mounting region ER of peripheral region PR of interior surface 130I of window 130.

Figure 7:
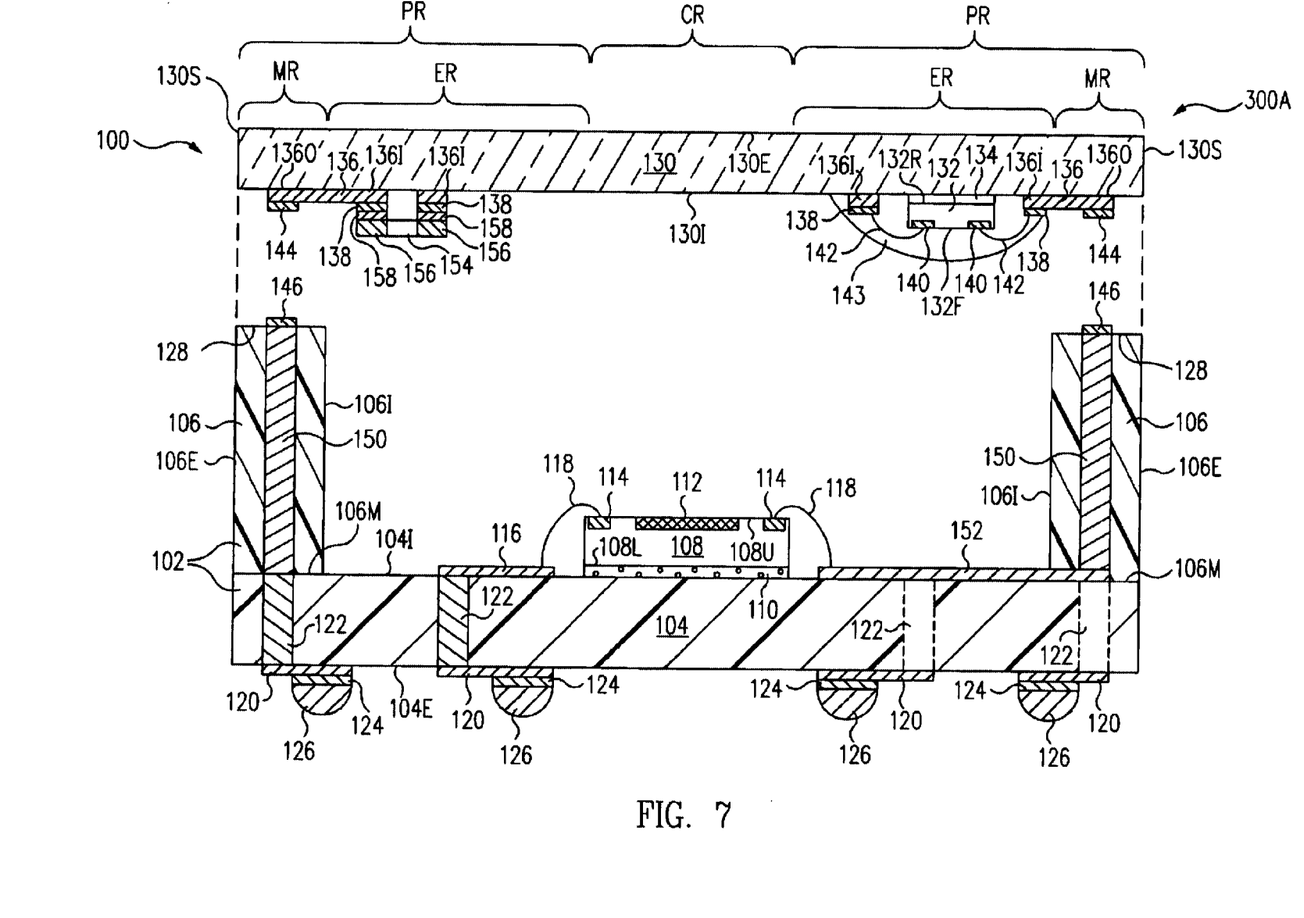
FIG. 7 is a cross-sectional view of the optical module of FIG. 1 during fabrication in accordance with one embodiment of the present invention.

FIG. 7 is a cross-sectional view of optical module 100 of FIG. 1 during fabrication in accordance with one embodiment of the present invention. Referring now to FIG. 7, window assembly 300A is aligned with substrate 102. More particularly, window mounting region MR of interior surface 130I of window 130 is aligned with window mounting and connection surface 128 of substrate 102. Window mounting region MR is aligned with window mounting and connection surface 128 such that outer ends 136O of component traces 136 and, if formed, component pads 144 are aligned with corresponding sidewall vias 150, and, if formed, substrate pads 146.

Referring now to FIGS. 1 and 7 together, bumps 148 are formed between outer ends 136O/component pads 144 and sidewall vias 150/substrate pads 146. Further, window adhesive 160 is formed between window mounting region MR and window mounting and connection surface 128. In one embodiment, bumps 148 and window adhesive 160 are formed simultaneously. However, in alternative embodiments, bumps 148 are formed before window adhesive 160 or vice versa.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A structure comprising:
   a window comprising a first surface, said first surface comprising a central region and a peripheral region, wherein said central region is unobstructed; and
   a first electronic component coupled to said peripheral region.

2. The structure of claim 1 further comprising a component trace coupled to said first surface of said window, a terminal of said first electronic component being coupled to said component trace.

3. The structure of the claim 2 wherein said terminal is coupled to an inner end of said component trace.

4. The structure of claim 3 wherein an outer end of said component trace comprises an input/output (I/O) pad.

5. The structure of claim 4 further comprising a window pad coupled to said outer end of said component trace, said window pad forming said input/output pad.

6. The structure of claim 4 wherein said peripheral region comprises a window mounting region, said outer end of said component trace being coupled to said window mounting region.

7. The structure of claim 6 wherein said peripheral region further comprises an electronic component mounting region, said inner end of said component trace being coupled to said electronic component mounting region.

8. The structure of claim 7 wherein said component trace extends from said electronic component mounting region to said window mounting region.

9. The structure of claim 2 wherein said terminal is coupled to said inner end of said component trace by a bond wire.

10. The structure of claim 2 wherein said terminal is coupled to said inner end of said component trace by a flip chip bump.

11. The structure of claim 2 wherein said terminal is coupled to said inner end of said component trace by a solder joint.

12. The structure of claim 1 wherein said electronic component is selected from the group consisting of a passive component, an active discrete component, and an active component.

13. A structure comprising:

a window comprising a first surface, said first surface comprising a central region and a peripheral region;

a first electronic component coupled to said peripheral region;

a substrate, said window being coupled to said substrate; and an image sensor coupled to said substrate, said image sensor being aligned with said central region.

14. The structure of claim 13 wherein said central region is unobstructed.

15. The structure of claim 13 wherein said image sensor comprises an active area, said active area being a receiver, a transmitter, or a transceiver of electromagnetic radiation.

16. The structure of claim 15 wherein said window is transparent to said electromagnetic radiation.

17. The structure of claim 13 wherein said electronic component comprises a terminal coupled to a bond pad of said image sensor.

18. A method comprising:

forming a component trace on a peripheral region of a first surface of a window;

mounting an electronic component to said peripheral region, wherein a terminal of said electronic component is coupled to said component trace.

19. The method of claim 18 wherein said peripheral region comprises an electronic component mounting region and a window mounting region, said electronic component being mounted to said electronic component mounting region, an outer end of said component trace forming an input/output pad on said window mounting region.

20. The method of claim 19 further comprising:

coupling said window mounting region of said window to a substrate; and coupling said outer end of said component trace to a substrate pad on said substrate.

\* \* \* \* \*